US006576885B2

United States Patent
Fang

(10) Patent No.: US 6,576,885 B2
(45) Date of Patent: Jun. 10, 2003

(54) HIGH SPEED CHARGING/DISCHARGING CIRCUIT HAVING A CAPACITIVE ELEMENT TO PROVIDE A NEGATIVE REFERENCE POTENTIAL

(75) Inventor: Yuan-Jui Fang, Taichung (TW)

(73) Assignee: Opto Tech Corporation, Hsin Chu (TW)

( * ) Notice: Subject to any disclaimer, the term of this patent is extended or adjusted under 35 U.S.C. 154(b) by 0 days.

(21) Appl. No.: 09/927,382

(22) Filed: Aug. 13, 2001

(65) Prior Publication Data

US 2003/0029990 A1 Feb. 13, 2003

(51) Int. Cl.[7] .................. H01J 40/14; G02B 27/00; H01L 31/00
(52) U.S. Cl. .............. 250/214 R; 250/551; 327/514
(58) Field of Search .................. 250/551, 214 R, 250/208.1, 214.1, 214 SW, 208.4; 327/428, 432, 439, 440, 478, 455, 514, 515

(56) References Cited

U.S. PATENT DOCUMENTS 4,754,175 A * 6/1988 Kobayashi et al. ......... 250/551
4,931,656 A * 6/1990 Ehalt et al. ................. 136/293

* cited by examiner

Primary Examiner—Stephone B. Allen
(74) Attorney, Agent, or Firm—Rosenberg, Klein & Lee

(57) ABSTRACT

A charging/discharging circuit comprises a PNP transistor controlled by a diode, an NPN transistor arranged on a discharging path and controlled by at least one photodiode, and a capacitor arranged between a photodiode and the NPN transistor. During charging stage, a charging current flows through the diode to produce a voltage drop, which cuts off the transistors to prevent leakage current. The photodiode generates a photo current such that the capacitor presents a negative voltage on one contact thereof, which facilitates the discharging process.

7 Claims, 2 Drawing Sheets

HIGH SPEED CHARGING/DISCHARGING CIRCUIT HAVING A CAPACITIVE ELEMENT TO PROVIDE A NEGATIVE REFERENCE POTENTIAL

FIELD OF THE INVENTION

The present invention relates to a charging/discharging circuit with fast operation, especially to a charging/discharging circuit using a negative reference voltage to speed up operation.

BACKGROUND OF THE INVENTION

The conventional charging/discharging circuit can be implemented by semiconductor switching elements. For example, the U.S. Pat. No. 4,754,175 "Solid state relay having a thyristor discharge circuit" by Kobayashi et al. discloses a charging/discharging circuit composed of a plurality of diodes and resistor. The resistor with larger resistance can suppress leakage current during charging operation. However, the response time of discharging operation is degraded due to reduction of discharging current. On the contrary, the resistor with smaller resistance can accelerate discharging operation, while the charging operation is degraded due to large leakage current. Therefore, the resistance is a trade off factor in charging/discharging circuit design.

Moreover, the charging/discharging circuit disclosed in above-mentioned patent comprises undue number of electronic elements; the process thereof is cumbersome. The conventional charging/discharging circuit generally uses ground level as lowest reference level for discharging operation. The response time of the discharging operation thereof is not satisfactory.

As shown in FIG. 1, another prior art charging/discharging circuit is the U.S. Pat. No. 4,931,656 "Means to dynamically discharge a capacitively charged electrical device" by Ehalt et al. This patent discloses a charging/discharging circuit composed of a resistor 40, an NPN transistor 44 and a photodiode 42. The photodiode 42 is used as switch element of the NPN transistor 44 for charging/discharging operation.

When the LED array 20 is driven to emit light, the photodiode array 30 receives the light and conducts a charging current flowing to an energy-storing element (a FET shown in this figure) 50 along a path C1 indicated by a dashed arrow shown at top of this figure. Most of the charging current then flows to the energy-storing element 50 along a path C2 due to the isolation provided by the resistive circuit 40. At the same time, the photodiode 42 also generates a photo current in response to the light of the LED array 20. The photo current of the photodiode 42 flows the emitter E of the NPN transistor 44 along a path C3. The NPN transistor 44 is cut off whereby the charging current is not leaked through the NPN transistor 44 and can rapidly charge the energy-storing element 50.

During the discharging stage of this charging/discharging circuit, the photodiode 42 does not receive light sufficient to conduct a photo current, part of the discharging current from the energy-storing element 50 flows to the base B of the NPN transistor 44 through a resistor 46 and along the path D3. Therefore, the NPN transistor 44 is turned on or saturated to conduct most of discharging current along paths D1 and D2.

However, in above-mentioned charging/discharging circuit, a resistive element 46 is still present, which imposes a dilemma to circuit design. Moreover, the above-mentioned charging/discharging circuit also uses ground level as lowest reference level for discharging operation. The response time of the discharging operation thereof is not satisfactory.

SUMMARY OF THE INVENTION

It is the object of the present invention to provide a charging/discharging circuit with fast operation In one aspect of the present invention, the charging/discharging circuit has an energy-storing element such as a capacitor on a discharging path thereof. During the charging stage, the capacitor is charged by a photodiode and establishes a negative reference voltage. The negative reference voltage can speed up discharging operation.

In one aspect of the present invention, the charging/discharging circuit uses transistors and diodes to replace resistive elements and the drawbacks caused by the resistive elements can be prevented.

The various objects and advantages of the present invention will be more readily understood from the following detailed description when read in conjunction with the appended drawing, in which:

DETAILED DESCRIPTION OF THE INVENTION

Figure 1:
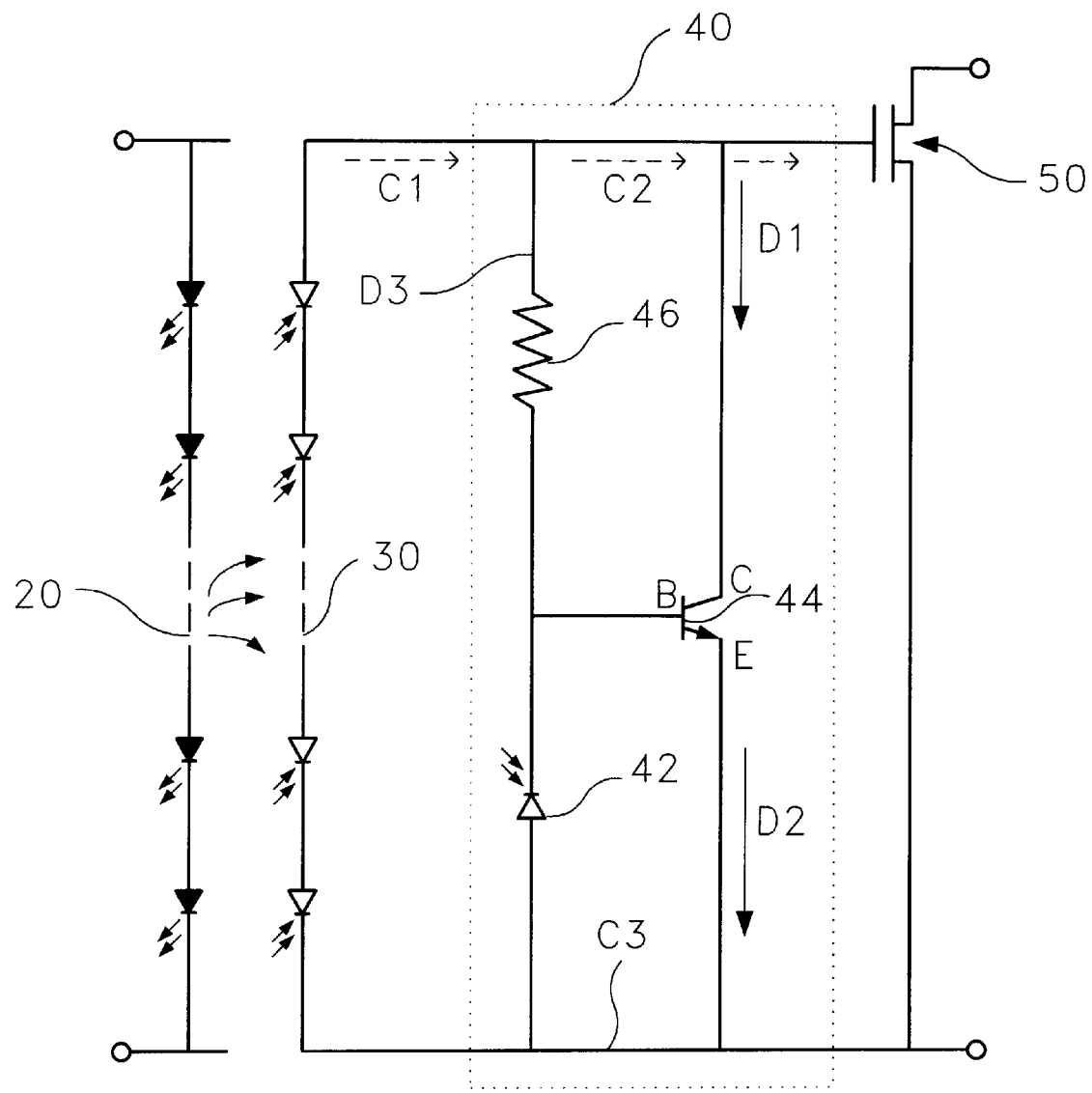
FIG. 1 shows a circuit diagram of prior art charging/discharging circuit.
Figure 2:
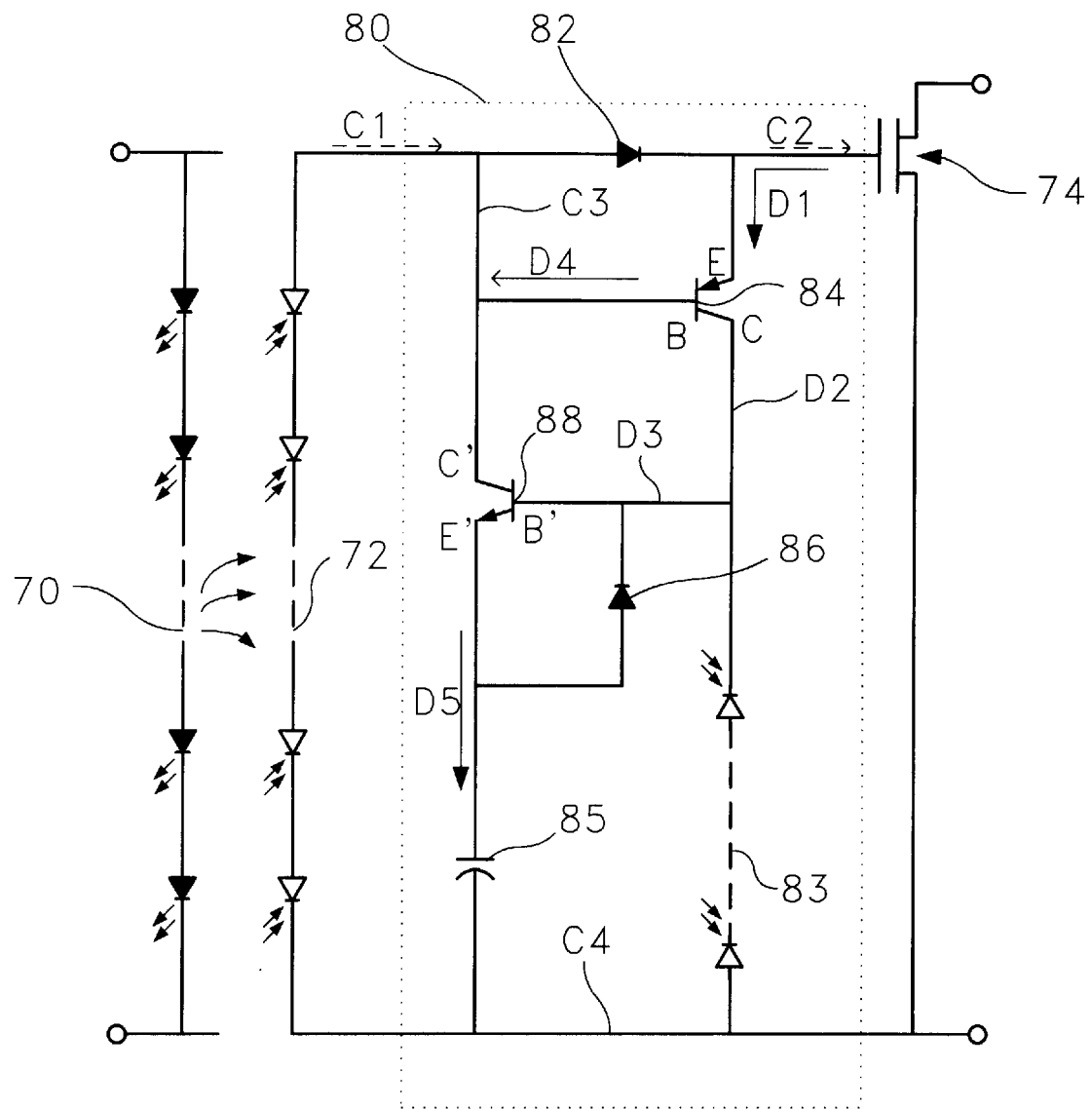
FIG. 2 shows a circuit diagram of the charging/discharging circuit according to a preferred embodiment of the present invention

FIG. 2 shows a circuit diagram of the charging/discharging circuit according to a preferred embodiment of the present invention. The charging/discharging circuit 80 of the present invention mainly comprises a first diode 82 connected to at least one external photodiode 72 on one end thereof, a first transistor 84 (for example, a PNP transistor) connected to another end (output end) of the first diode 82, an internal energy-storing element 85 (for example, a capacitor) connected to at least one internal photodiode 83 on one end thereof, a second transistor 88 (for example, an NPN transistor) connected to another end of the internal energy-storing element 85, and a second diode 86. The PNP transistor 84 has an emitter E connected to the output end of the first diode 82, a base B connected to the external photodiode 72 and the collector C' of the NPN transistor 88, and a collector C connected to the base B' of the NPN transistor 88. Another end of the capacitor 85 is connected both to the emitter E' of the NPN transistor 88 and an input end of the second diode 86. The second diode 86 has an output end connected to the base B' of the NPN transistor 88.

During the charging stage, at least one LED 70 is driven to emit light, which is received by the external photodiode 72 to produce a photo current functioned as charging current. The charging current flows along the paths C1 and C2 and through the first diode 82. The first diode 82 provides a voltage drop across two ends thereof such that the emitter E of the PNP transistor 84 has a lower voltage level than the base B of the PNP transistor 84, and the PNP transistor 84 is cut off. At the same time, the internal photodiode 83 also receives light from the LED 70 and conducts a photo current, which flows to the internal energy-storing element 85 (such as capacitor, MOSFET, or IGBT) along path C4. In this embodiment, the internal energy-storing element 85 is a capacitor and the terminal of the capacitor 85 connected to the NPN transistor 88 has a voltage level lower than ground level. The base B' of the NPN transistor 88 has a voltage level lower than the emitter E' of the NPN transistor 88 due to voltage drop across the second diode 86. The e NPN transistor 88 is also cut off. Therefore, almost all of the charging current flows along the path C2 to an external energy-storing element 74 without leaking to the NPN transistor 88 and the PNP transistor 84. The external energy-storing element 74 can be rapidly charged.

Moreover, during the discharging stage, the discharging current flowing from the external energy-storing element 74 is blocked by the first diode 82 and then flows along the path D1 into the emitter E of the PNP transistor 84. At this time, the emitter E of the PNP transistor 84 has a higher voltage level than the base B of the PNP transistor 84, and the PNP transistor 84 is turned on. The discharging current flows through E-C junction of the PNP transistor 84. Moreover, part of the discharging current flows to the base B' of the NPN transistor 88 along the path D3 such that the base B' of the NPN transistor 88 has a voltage level higher than the emitter E' of the NPN transistor 88, and the e NPN transistor 88 is also turned on. Moreover, the terminal of the capacitor 85 connected to the NPN transistor 88 has a negative voltage level lower than ground level, thereby facilitating discharging. The discharging current can rapidly flow through the PNP transistor 84, the path D4, the NPN transistor 88, the path D5 and the capacitor 85.

In the present invention, the internal energy-storing element 85 provides a negative voltage reference to speed up the discharging operation. The discharging effect of the inventive charging/discharging circuit is superior to the conventional charging/discharging circuit with ground level reference.

Moreover, in the inventive charging/discharging circuit, the resistive elements are replaced by transistors and diodes and the drawbacks caused by the resistive elements can be prevented. The internal energy-storing element is used speed up the discharging operation and can also be replaced by transistors and diodes.

The external photodiode 72 and the internal photodiode 83 can be replaced by a photodiode array divided into two groups, each group of photodiodes has opposite orientation with each other. Therefore, the two groups of photodiodes have photo current in opposite direction when receiving light.

To sum up, the inventive charging/discharging circuit uses a capacitor to provide negative reference voltage and does not involve any resistive element, whereby the charging/discharging speed can be greatly enhanced.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

I claim:

1. A charging/discharging circuit mainly comprising:
    a first diode having an anode connected to at least one external photodiode and a cathode coupled to an external energy storage element;
    a first transistor connected to the cathode of the first diode on a first contact thereof, and connected to the external photodiode on a second contact thereof
    at least one internal photodiode having a cathode connected to a third contact of said first transistor;
    a second transistor connected the second contact of the first transistor on a first contact thereof, the second transistor having a second contact connected to the third contact of the first transistor;
    a second diode having a cathode connected to the second contact of the second transistor and an anode connected to a third contact of the second transistor; and,
    an internal energy-storing element having one end connected to the third contact of the second transistor and another end connected to an anode of the at least one internal photodiode for negatively biasing the third contact of the second transistor during charging of the external energy storage element.

2. The charging/discharging circuit as in claim 1, wherein the internal energy-storing element is selected from the group consisting of a capacitor, a MOSFET, a IGBT and a combination thereof.

3. The charging/discharging circuit as in claim 1, wherein the external photodiode and the internal photodiode are assembled in a photodiode array.

4. The charging/discharging circuit as in claim 1, wherein the first transistor is a PNP transistor.

5. The charging/discharging circuit as in claim 4, wherein in the PNP transistor, the first contact is an emitter, the second contact is a base and the third contact is a collector.

6. The charging/discharging circuit as in claim 1, wherein the second transistor is an NPN transistor.

7. The charging/discharging circuit as in claim 1, wherein in the NPN transistor, the first contact is a collector, the second contact is a base and the third contact is an emitter.

* * * * *